(12) United States Patent
Shirasaki

(10) Patent No.: US 6,876,254 B2
(45) Date of Patent: Apr. 5, 2005

(54) DUAL AMPLIFIER CIRCUIT AND TFT DISPLAY DRIVING CIRCUIT USING THE SAME

(75) Inventor: Hijiri Shirasaki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 40 days.

(21) Appl. No.: 10/406,607

(22) Filed: Apr. 4, 2003

(65) Prior Publication Data
US 2004/0196098 A1 Oct. 7, 2004

(51) Int. Cl.[7] .............................. H03F 1/14; H03F 3/68
(52) U.S. Cl. ........................................ 330/51; 330/295
(58) Field of Search ............................... 330/51, 124 R, 330/295, 308

(56) References Cited

U.S. PATENT DOCUMENTS 5,256,987 A * 10/1993 Kibayashi et al. .......... 330/295

* cited by examiner

Primary Examiner—Steven J. Mottola
(74) Attorney, Agent, or Firm—Volentine Francos & Whitt, PLLC

(57) ABSTRACT

A method for controlling a dual-amplifier circuit, including the steps of providing an input terminal and an output terminals; providing first and second amplifiers coupled in parallel between the input terminal and the output terminal; alternately selecting one of the first and second amplifiers for use; and decreasing the amount of electrical current flowing through not-selected amplifier.

14 Claims, 6 Drawing Sheets

DUAL AMPLIFIER CIRCUIT AND TFT DISPLAY DRIVING CIRCUIT USING THE SAME

TECHNICAL FIELD OF THE INVENTION

The present invention relates to a circuit for driving a TFT (Thin Film Transistor) LCD (Liquid Crystal Display), particularly to, a dual-amplifier and a sample/hold circuit used in such a driving circuit.

BACKGROUND OF THE INVENTION

The present invention is applicable to a dual-amplifier/sample-hold circuit used in a TFT source/driver IC.

A conventional dual-sample/hold circuit includes an analog input terminal, an analog output terminal, a pair of capacitors and a pair of amplifiers and, which are connected in parallel between the input terminal and the output terminal. The sample/hold circuit stores levels of an input signal RGB and outputs an amplified signal to a TFT display. The sample/hold circuit is called "parallel two latch sample-hold/parallel two latch buffer-amplifier" type.

In operation, an input level is sampled at the capacitors alternately, and then, the sampled level is amplified by the amplifiers. This operation is repeated to output the sampled signal (level) to the output terminal alternately. For a 280-channel of TFT driver, two hundred and eighty of sample-hold circuits are required to use.

A conventional a push-pull type amplifier includes a first supply terminal VDD to which a first level of supply voltage is provided; a second supply terminal GND to which a second level of supply voltage is provided; and a control transistor unit, which is coupled between the first and second supply terminals VDD and GND. The control transistor unit includes a PMOS transistor and a NMOS transistor. Gates of the PMOS transistor and NMOS transistor are applied with bias voltage signals independently.

Levels of the bias voltage signals can be changed to control power consumption and response speed. Generally, when a level of the bias voltage applied to the PMOS transistor is increased and a level of the bias voltage applied to the NMOS transistor is decreased, power consumption is lowered and response speed is lowered. On the other hand, when a level of the bias voltage applied to the PMOS transistor is decreased and a level of the bias voltage applied to the NMOS transistor is increased, power consumption is increased and response speed becomes faster.

According to the above-described amplifier, it is difficult to decrease power consumption at the same time to increase response speed.

OBJECTS OF THE INVENTION

Accordingly, it is an object of the present invention to provide a dual-amplifier circuit having low power consumption and faster response speed.

Another object of the present invention is to provide a TFT display driving circuit having low power consumption and faster response speed.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a method for controlling a dual-amplifier circuit, including the steps of providing an input terminal and an output terminals; providing first and second amplifiers coupled in parallel between the input terminal and the output terminal; alternately selecting one of the first and second amplifiers for use; and decreasing the amount of electrical current flowing through not-selected amplifier.

According to a second aspect of the present invention, a dual-amplifier circuit includes an input terminal to which an input signal is supplied; an output terminal from which an output signal is supplied; a first amplifier coupled between the input terminal and the output terminal; a second amplifier coupled in parallel to the first amplifier between the input terminal and the output terminal; a selecting circuit which supplies a selection signal to couple one of the first and second amplifiers alternately between the input terminal and the output terminal. Each of the first and second amplifiers comprises: 1) a first supply terminal to which a first level of supply voltage is provided; 2) a second supply terminal to which a second level of supply voltage is provided; and 3) a control transistor unit, which is coupled between the first and second supply terminals and a gate of which is applied with a bias voltage. A resistance value of the control transistor unit is increased when the corresponding amplifier is not selected for use.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

For better understanding of the present invention, background technology will be described first referring to FIGS. 1 and 2.

Figure 1:
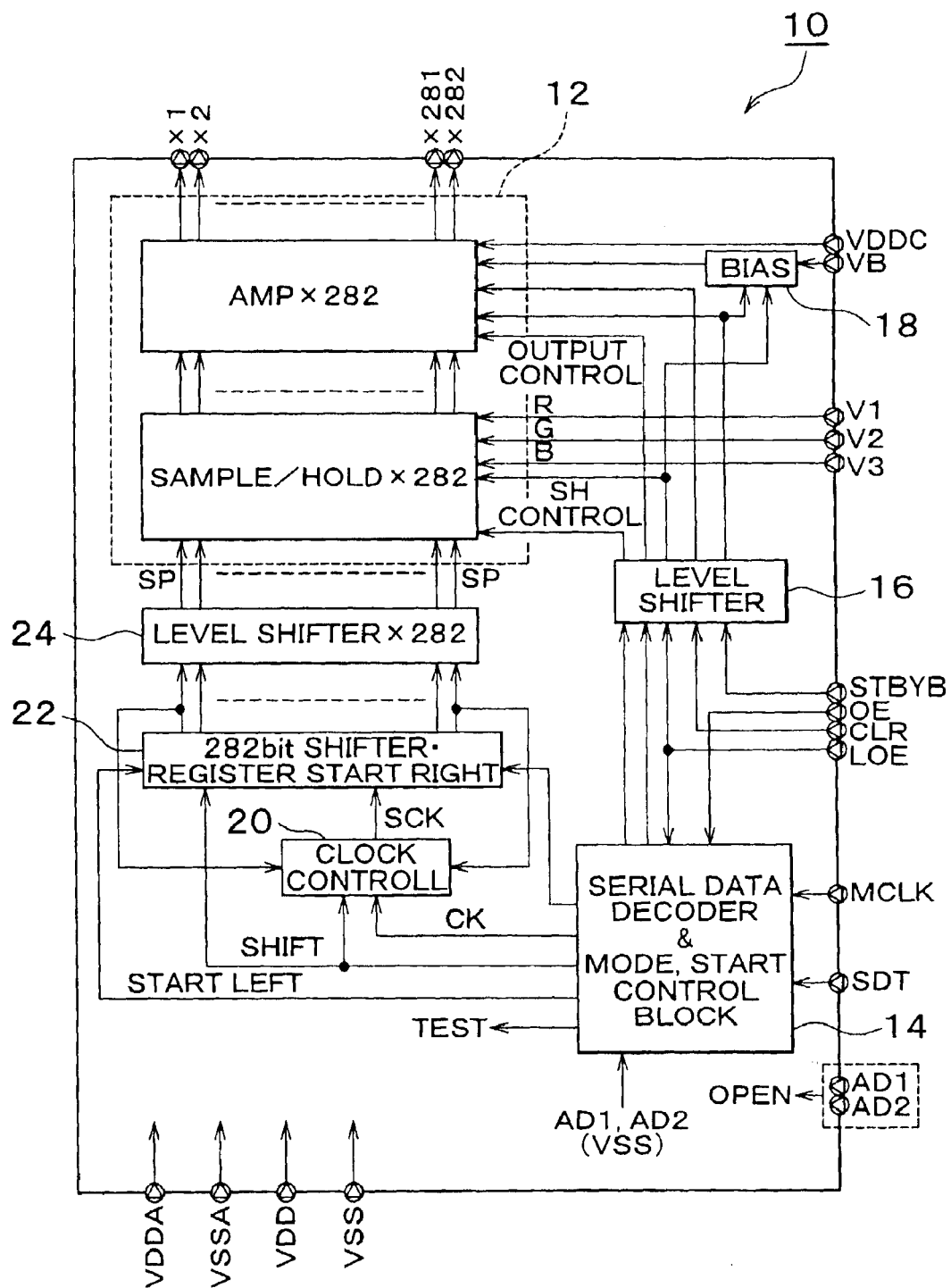
FIG. 1 is a block diagram showing a TFT driving circuit according to the present invention.

FIG. 1 is a block diagram showing a TFT driving circuit according to the present invention. A TFT driving circuit 10 includes a dual-amplifier hold circuit 12; a serial data decoder/mode start control block 14; a level shifter 16; a bias circuit 18; a clock controller 20; a 282-bit shifter 22 and a 282-bit shifter register 24.

Figure 2:
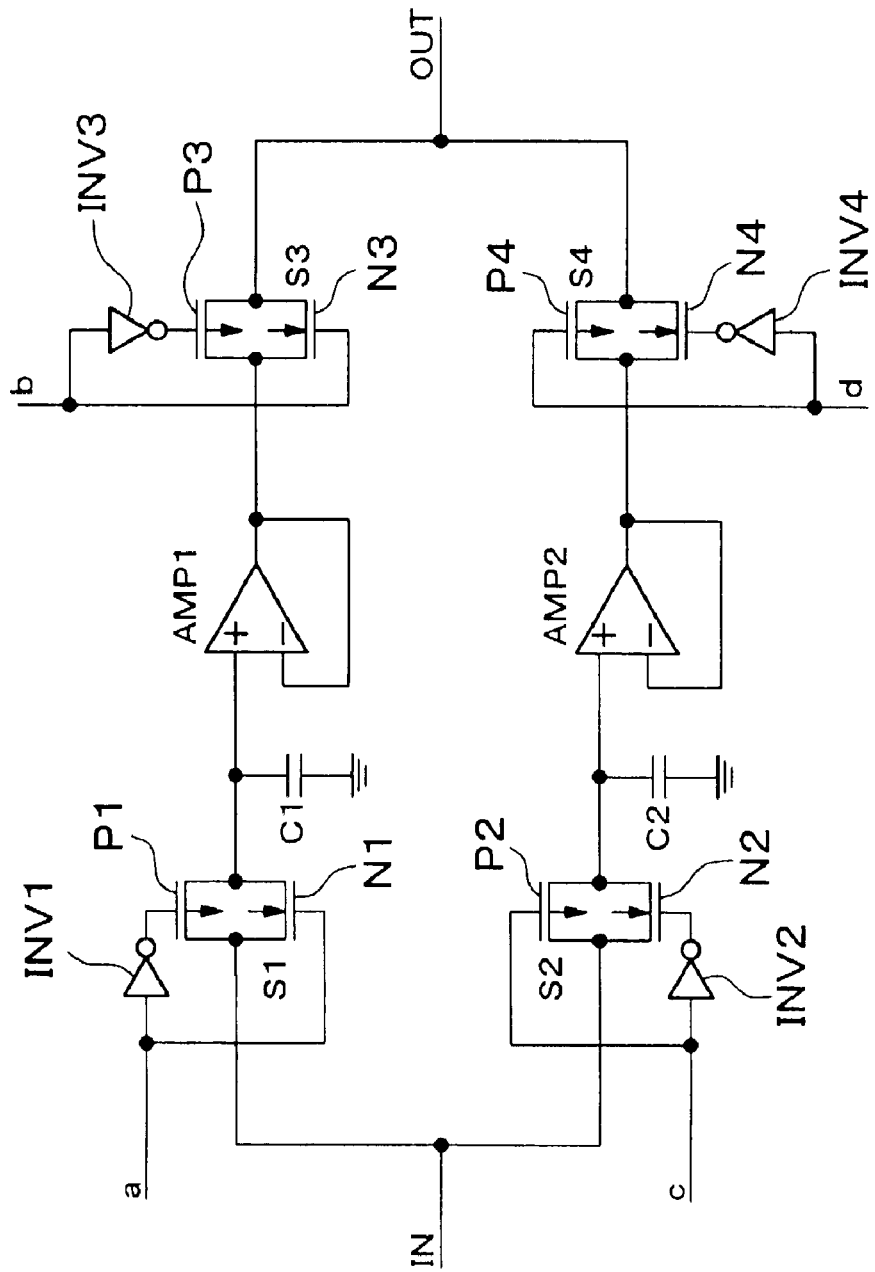
FIG. 2 is a circuit diagram showing a sample/hold circuit according to the present invention.

FIG. 2 is a circuit diagram showing a sample/hold circuit according to the present invention. The sample-hold circuit includes an analog input terminal IN, an analog output terminal OUT, inverters INV1 to INV4, PMOS transistors P1 to P4, NMOS transistors N1 to N4, capacitors C1 and C2, and amplifiers AMP1 and AMP2. The sample/hold circuit stores levels of an input signal RGB and outputs an amplified signal to a TFT display, which is not shown. The sample/hold circuit is called "parallel two latch sample-hold/ parallel two latch buffer-amplifier" type.

The amplifier AMP1 is coupled between the input terminal IN and the output terminal OUT. The amplifier AMP2 is coupled in parallel to the other amplifier AMP1 between the input terminal IN and the output terminal OUT. The PMOS transistor P1 and NMOS transistor N1 form a switch circuit S1. The PMOS transistor P2 and NMOS transistor N2 form a switch circuit S2. The PMOS transistor P3 and NMOS transistor N3 form a switch circuit S3. The PMOS transistor P4 and NMOS transistor N4 form a switch circuit S4. The switch circuits S1 to S4 supplies a selection signal to couple one of the amplifiers AMP 1 and AMP2 alternately between the input terminal IN and the output terminal OUT.

A terminal "a" is connected to an input terminal of the inverter INV1 and a gate of the NMOS transistor N1. A source of the PMOS transistor P1 and a drain of the NMOS transistor N1 are commonly connected to the input terminal IN. A drain of the PMOS transistor P1 and a source of the NMOS transistor N1 are connected to the capacitor C1 and to an input terminal of the amplifier AMP1. An output terminal of the inverter INV1 is connected to a gate of the PMOS transistor P1. An output terminal of the amplifier AMP1 is connected to another input terminal thereof.

A terminal "b" is connected to an input terminal of the inverter INV2 and a gate of the PMOS transistor P2. A source of the PMOS transistor P2 and a drain of the NMOS transistor N2 are commonly connected to the input terminal IN. A drain of the PMOS transistor P2 and a source of the NMOS transistor N2 are connected to the capacitor C2 and to an input terminal of the amplifier AMP2. An output terminal of the inverter INV2 is connected to a gate of the NMOS transistor N2. An output terminal of the amplifier AMP2 is connected to another input terminal thereof.

A terminal "b" is connected to an input terminal of the inverter INV3 and a gate of the NMOS transistor N3. An output terminal of the inverter INV3 is connected to a gate of the PMOS transistor P3. A drain of the PMOS transistor P3 and a source of the NMOS transistor N3 are commonly connected to the output terminal of the amplifier AMP1. A source of the PMOS transistor P3 and a drain of the NMOS transistor N3 are commonly connected to the output terminal OUT.

A terminal "d" is connected to an input terminal of the inverter INV4 and a gate of the PMOS transistor P4. An output terminal of the inverter INV4 is connected to a gate of the NMOS transistor N4. A drain of the PMOS transistor P4 and a source of the NMOS transistor N4 are commonly connected to the output terminal of the amplifier AMP2. A source of the PMOS transistor P4 and a drain of the NMOS transistor N4 are commonly connected to the output terminal OUT.

In operation, when the switch circuits S1 and S4 are turned on, an input signal is sampled at the capacitor C1. After that, when the switch circuits S2 and S3 are turned on, an input signal is sampled at the capacitor C2. This operation is repeated to output the sampled signal (level) to the output terminal alternately. For a 280-channel of driver, two hundred and eighty of sample-hold circuits are required to use.

Figure 3:
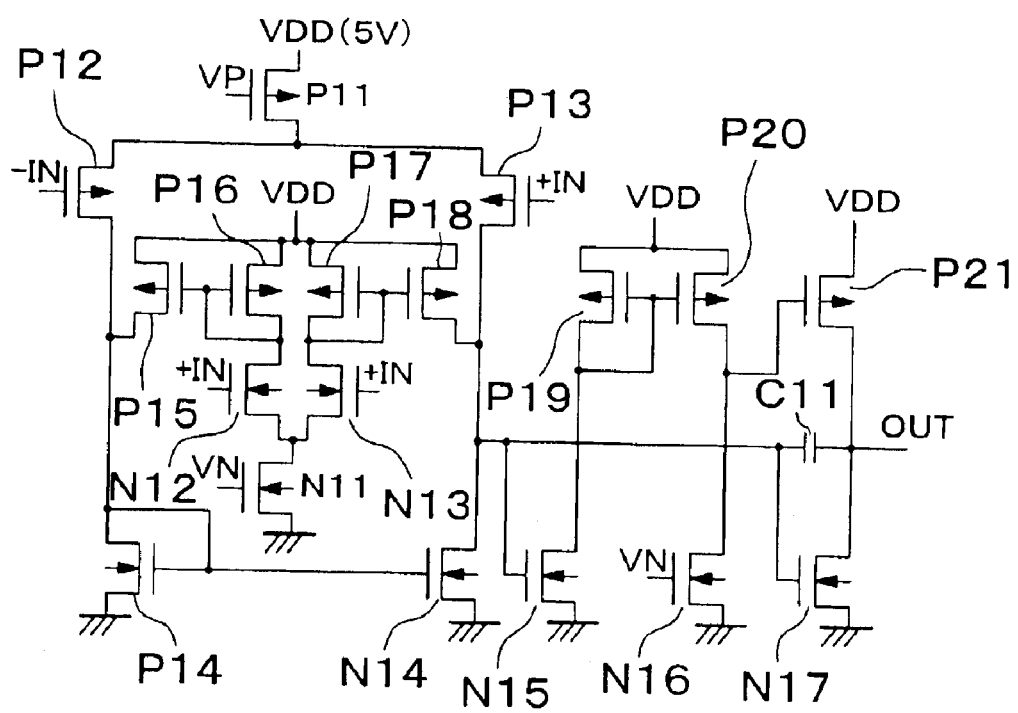
FIG. 3 is a circuit diagram showing a push-pull type amplifier.

FIG. 3 is a circuit diagram showing a push-pull type amplifier, which is applicable to the amplifiers AMP1 and AMP2. The amplifier includes a first supply terminal VDD to which a first level of supply voltage is provided; a second supply terminal GND to which a second level of supply voltage is provided; and a control transistor unit (P11, N11 and N16), which are coupled between the first and second supply terminals VDD and GND. The control transistor unit includes a PMOS transistor P11 and a NMOS transistor N11. A gate of the PMOS transistor P11 is applied with a bias voltage VP. Gates of the NMOS transistors N11 and N16 are applied with a bias voltage VN.

Levels of the bias voltage VP and VN can be changed to control power consumption and response speed. Generally, when a level of the bias voltage VP is increased and a level of the bias voltage VN is decreased, power consumption is lowered and response speed is lowered. On the other hand, when a level of the bias voltage VP is decreased and a level of the bias voltage VN is increased, power consumption is increased and response speed becomes faster.

The amplifier also includes other PMOS transistors P12, P13, P14, P15, P16, P17, P18, P19, P20 and P21, other NMOS transistors N12, N13, N14, N15 and N17 and a capacitor C11. Source and drain of the PMOS transistor P11 is connected to the supply terminal VDD and to sources of the PMOS transistors P12 and P13, respectively. A gate of the PMOS transistor P12 is connected to an input terminal +IN. A drain of the PMOS transistor P12 is connected to a drain of the PMOS transistor P15, a source of the PMOS transistor P14 and gates of the PMOS transistor P14 and the NMOS transistor N14. A gate of the PMOS transistor P13 is connected to an input terminal −IN. A drain of the PMOS transistor P13 is connected to a drain of the PMOS transistor P18, a drain of the NMOS transistor N14, gates of the NMOS transistors N15 and N17 and the capacitor C1.

Sources of the NMOS transistors N11, N14, N15, N16 and N17 and a drain of the PMOS transistor P14 are connected to the supply terminal GND. Sources of the PMOS transistors P15, P16, P17, P18, P19, P20 and P21 are connected to the supply terminal VDD. A gate of the PMOS transistor P15 is connected to a gate and a drain of the PMOS transistor P16 and to a drain of the NMOS transistor N12. A gate of the PMOS transistor P17 is connected to a gate of the PMOS transistor, a drain thereof and to a drain of the NMOS transistor N13. A drain of the PMOS transistor P18 is connected to a drain of the NMOS transistor N14, gates of the NMOS transistors N15 and N17 and to the capacitor C1.

A gate of the PMOS transistor P19 is connected to a gate of the PMOS transistor P20, a drain thereof, and to a drain of the NMOS transistor N15. A drain of the PMOS transistor P20 is connected to a gate of the PMOS transistor P21 and a drain of the NMOS transistor N16. An output terminal OUT is connected to the capacitor C11, a drain of the PMOS transistor P21 and a drain of the NMOS transistor N17.

A drain of the NMOS transistor N11 is connected to source of the NMOS transistors N12 and N13. Gates of the NMOS transistors N12 and N13 are connected to the input terminal +IN.

According to the above-described amplifier, it is difficult to decrease power consumption at the same time to increase response speed.

Figure 4:
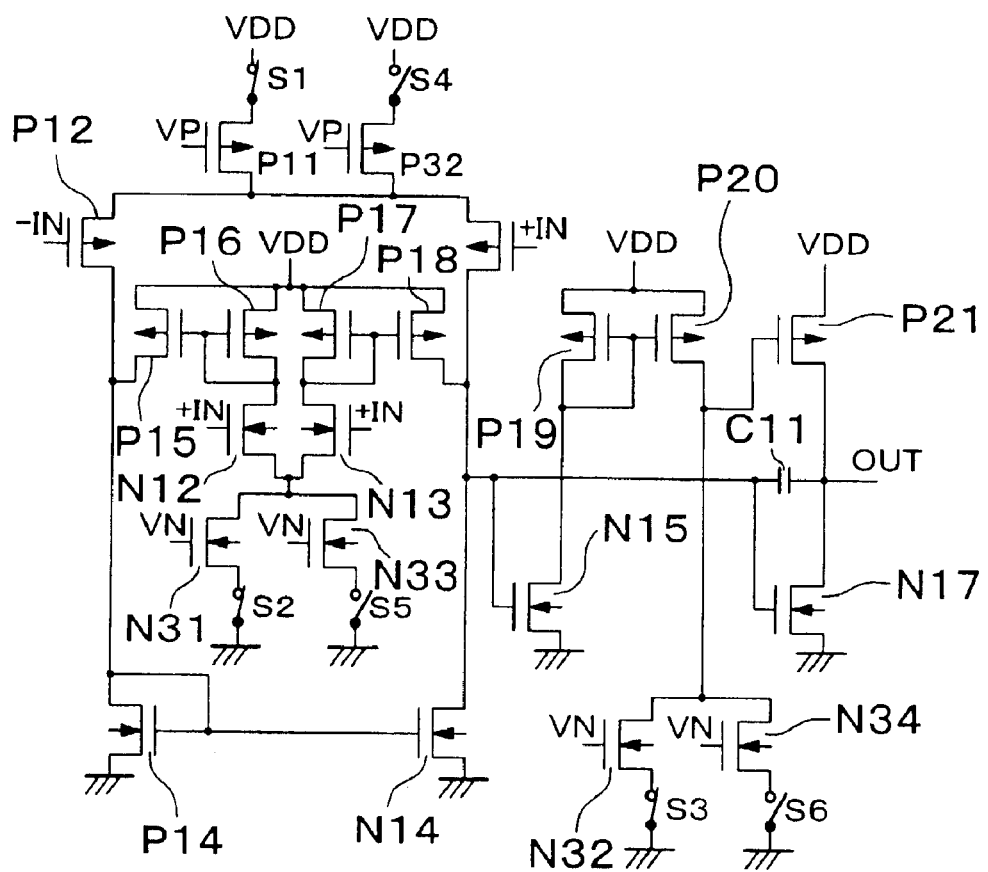
FIG. 4 is a circuit diagram showing a push-pull type amplifier according to a first preferred embodiment of the present invention.

FIG. 4 is a circuit diagram showing a push-pull type amplifier according to a first preferred embodiment of the present invention. In FIG. 4, the same and corresponding components to those in FIG. 3 are represented by the same reference symbols and the same description is not repeated.

The amplifier includes input terminals −IN and +IN; an output terminal OUT; a capacitor C11; a first supply terminal VDD; a second supply terminal, which is the ground; PMOS transistors P11 to P21 and P32; NMOS transistors N12 to N15, N17 and N31 to N34; and switch circuits S1 to S6.

A control transistor unit is formed by the PMOS transistors P11 and P32, and the NMOS transistors N31 to N34. Gates of the PMOS transistors P11 and P32 are applied with a bias voltage VP. Gates of the NMOS transistors N31 to N34 are applied with a bias voltage VN. Levels of the bias voltage VP and VN can be changed to control power consumption and response speed. Generally, when a level of the bias voltage VP is increased and a level of the bias voltage VN is decreased, power consumption is lowered and response speed is lowered. On the other hand, when a level of the bias voltage VP is decreased and a level of the bias voltage VN is increased, power consumption is increased and response speed becomes faster.

The switch circuit S1 is connected between the first supply terminal VDD and a source of the PMOS transistor P11. The switch circuit S4 is connected between the first supply terminal VDD and a source of the PMOS transistor P32. Drains of the PMOS transistors P11 and P32 are connected to a source of the PMOS transistor P12 and a source of the PMOS transistor P13, respectively.

Drains of the NMOS transistors N31 and N33 are connected to sources of the NMOS transistors N12 and N13. The switch circuit S2 is connected between the second supply terminal GND and a source of the NMOS transistor N31. The switch circuit S5 is connected between the second supply terminal GND and a source of the NMOS transistor N33.

The switch circuit S3 is connected between the second supply terminal GND and a source of the NMOS transistor N32. The switch circuit S6 is connected between the second supply terminal GND and a source of the NMOS transistor N34. Drains of the NMOS transistors N32 and N34 are connected to a gate of the PMOS transistor P21 and a drain of the PMOS transistor P20.

On-resistance values of the PMOS transistor P32 and the NMOS transistors N33 and N34 are determined to be a double of those of the PMOS transistor P11 and the NMOS transistors N31 and N32. The PMOS transistor P32 and the NMOS transistors N33 and N34 are selected for use by the switch circuits S1 to S6 when the amplifier is not in operation (FIG. 2). As a result, when the amplifier is not in operation, consumption current becomes half of that in operation mode.

In more detail, when the amplifier is in operation, the switch circuits S1 to S3 are turned on, so that the PMOS transistor P11 and the NMOS transistors N31 and N32 are selected for use. On the other hand, when the amplifier is not in operation, the switch circuits S2 to S6 are turned on, so that the PMOS transistor P32 and the NMOS transistors N33 and N34 are selected for use. As a result, current consumption becomes half of that in operation mode. The switch circuits S1 to S6 can be driven in accordance with a selection signal, used in a circuit shown in FIG. 2 for switching the amplifiers AMP1 and AMP2.

As described above, according to the first preferred embodiment, the amplifiers AMP1 and AMP2 can be used effectively in current. That is because; the amplifier in non-operation mode only needs a half of current that is used for the amplifier in operation mode. The total current consumption of the dual-amplifier circuit, shown in FIG. 2, becomes ¾ of conventional circuit. It should be noted that if current flowing through the amplifier in non-operation mode is shut off, the response speed of the amplifier becomes slower.

Figure 5:
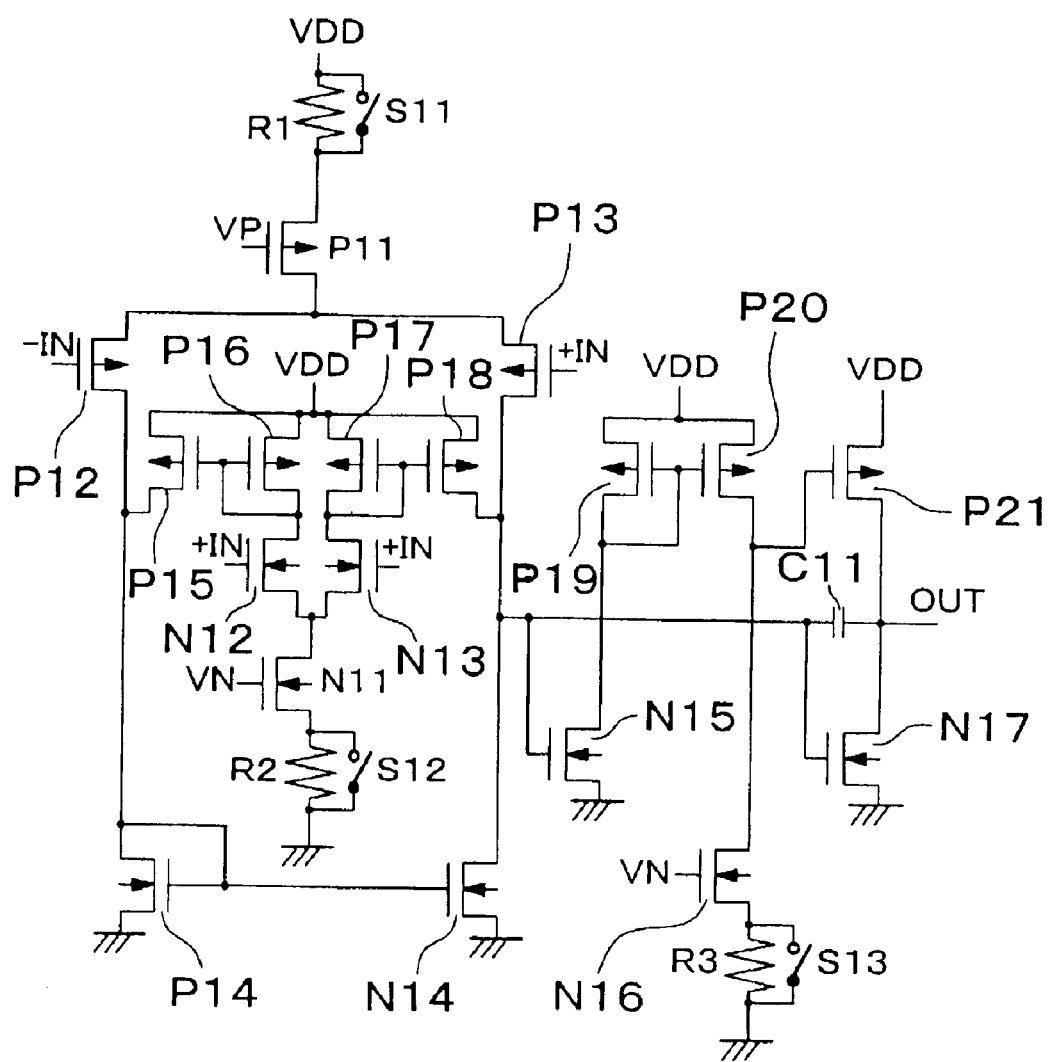
FIG. 5 is a circuit diagram showing a push-pull type amplifier according to a second preferred embodiment of the present invention.

FIG. 5 is a circuit diagram showing a push-pull type amplifier according to a second preferred embodiment of the present invention. In FIG. 5, the same and corresponding components to those in FIGS. 3 and 4 are represented by the same reference symbols and the same description is not repeated.

The amplifier includes input terminals −IN and +IN; an output terminal OUT; a capacitor C11; a first supply terminal VDD; a second supply terminal, which is the ground; PMOS transistors P11 to P21; NMOS transistors N11 to N17; resistances R1, R2 and R3; and switch circuits S11, S12 and S13.

The resistance R1 is connected between the first supply terminal VDD and a source of the PMOS transistor P11. The resistance R2 is connected between the second supply terminal GND and a source of the NMOS transistor N11. The resistance R3 is connected between the second supply terminal GND and a source of the NMOS transistor N16. The switch circuit S11 is connected in parallel to the resistance R1. The switch circuit S12 is connected in parallel to the resistance R2. The switch circuit S13 is connected in parallel to the resistance R3.

In operation, when the amplifier is in operation, the switch circuits S11 to S13 are turned off. On the other hand, when the amplifier is not in operation, the switch circuits S11 to S13 are turned on. As a result, current consumption becomes half of that in operation mode. The switch circuits S11 to S13 can be driven in accordance with a selection signal, used in a circuit shown in FIG. 2 for switching the amplifiers AMP1 and AMP2.

As described above, according to the second preferred embodiment, the amplifiers AMP1 and AMP2 can be used effectively in current. The total current consumption of the dual-amplifier circuit, shown in FIG. 2, becomes lower. As compared to the above-described first preferred embodiment, this second preferred embodiment has an advantage in that a smaller number of switch circuits are used.

Figure 6:
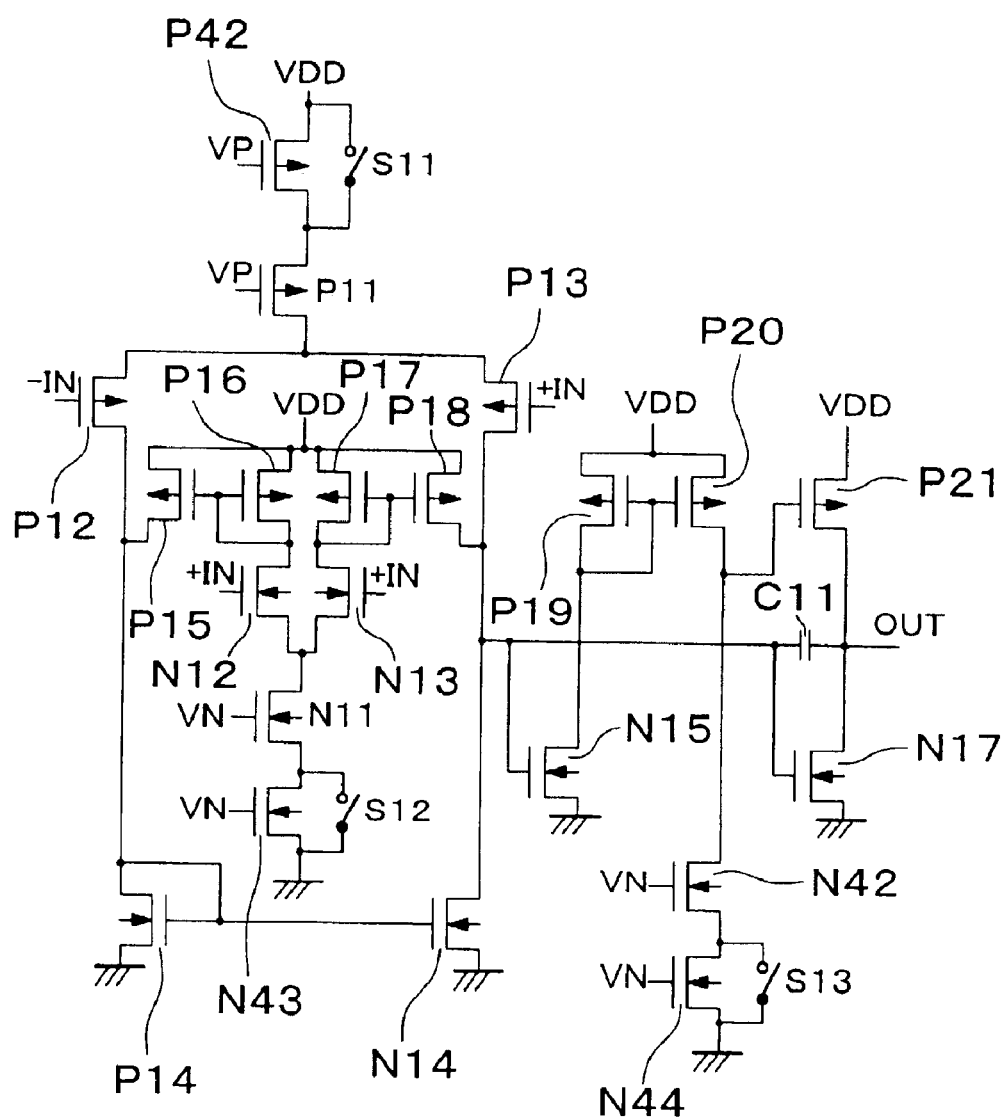
FIG. 6 is a circuit diagram showing a push-pull type amplifier according to a third preferred embodiment of the present invention.

FIG. 6 is a circuit diagram showing a push-pull type amplifier according to a third preferred embodiment of the present invention. In FIG. 6, the same and corresponding components to those in FIGS. 3 to 5 are represented by the same reference symbols and the same description is not repeated.

The amplifier includes input terminals −IN and +IN; an output terminal OUT; a capacitor C11; a first supply terminal VDD; a second supply terminal, which is the ground; PMOS transistors P11 to P21 and P42; NMOS transistors N11 to N15, N17 and N42 to N44; and switch circuits S11, S12 and S13.

The PMOS transistor P42 is connected in series between the first supply terminal VDD and a source of the PMOS transistor P11. The NMOS transistor N43 is connected in series between the second supply terminal GND and a source of the NMOS transistor N11. The NMOS transistor N42 is connected in series between the second supply terminal GND and a source of the NMOS transistor N42. A drain of the NMOS transistor N42 is connected to a gate of the PMOS transistor P21 and to a drain of the PMOS transistor P20. A bias voltage VN is applied to gates of the PMOS transistor P42 and the NMOS transistors N42 to N44.

The switch circuit S11 is connected in parallel to the PMOS transistor P42. The switch circuit S12 is connected in parallel to the NMOS transistor N43. The switch circuit S13 is connected in parallel to the NMOS transistor N44.

On-resistance values of the PMOS transistor P42 and the NMOS transistors N43 and N44 are determined to be double of those of the PMOS transistor P11 and the NMOS transistors N11 and N42, respectively.

In operation, when the amplifier is in operation, the switch circuits S11 to S13 are turned off. On the other hand, when the amplifier is not in operation, the switch circuits S11 to S13 are turned on. As a result, current consumption becomes half of that in operation mode. The switch circuits S11 to S13 can be driven in accordance with a selection signal, used in a circuit shown in FIG. 2 for switching the amplifiers AMP1 and AMP2.

As described above, according to the second preferred embodiment, the amplifiers AMP1 and AMP2 can be used effectively in current. The total current consumption of the dual-amplifier circuit, shown in FIG. 2, becomes lower. As compared to the above-described first preferred embodiment, this third preferred embodiment has an advantage in that a smaller number of switch circuits are used. Further, as compared to the second preferred embodiment, this third preferred embodiment has an advantage in that a circuitry layout can be designed with more flexibly.

What is claimed is:

1. A dual-amplifier circuit, comprising:
   an input terminal to which an input signal is supplied;
   an output terminal from which an output signal is supplied;
   a first amplifier coupled between the input terminal and the output terminal;
   a second amplifier coupled in parallel to the first amplifier between the input terminal and the output terminal;
   a selecting circuit which supplies a selection signal to couple one of the first and second amplifiers alternately between the input terminal and the output terminal, wherein
   each of the first and second amplifiers comprises:
   1) a first supply terminal to which a first level of supply voltage is provided;
   2) a second supply terminal to which a second level of supply voltage is provided; and
   3) a control transistor unit, which is coupled between the first and second supply terminals and a gate of which is applied with a bias voltage,
   wherein a resistance value of the control transistor unit is increased when the corresponding amplifier is not selected for use.

2. A dual-amplifier circuit, according to claim 1, wherein the control transistor unit comprises:
   1) first and second PMOS transistors, which are coupled in parallel to each other between the first and second supply terminals and each of which has a gate applied with a first bias voltage, the first and second PMOS transistors having different on-resistance values;
   2) first and second NMOS transistors, which are coupled in parallel to each other between the first and second supply terminals and each of which has a gate applied with a second bias voltage, the first and second NMOS transistors having different on-resistance values; and
   3) a first switch circuit, which selects one of the first and second PMOS transistors for operation in accordance with the selection signal; and 4) a second switch circuit, which selects one of the first and second NMOS transistors for operation in accordance with the selection signal.

3. A dual-amplifier circuit, according to claim 2, wherein the control transistor unit further comprises:
   1) third and fourth NMOS transistors, which are coupled in parallel to each other between the first and second supply terminals and each of which has a gate applied with the second bias voltage, the second and third NMOS transistors having different on-resistance values; and
   2) a third switch circuit, which selects one of the third and fourth NMOS transistors for operation in accordance with the selection signal.

4. A dual-amplifier circuit, according to claim 1, wherein the control transistor unit comprises:
   1) a first PMOS transistor, which is coupled between the first and second supply terminals and has a gate applied with a first bias voltage;
   2) a first NMOS transistor, which is coupled between the first and second supply terminals and has a gate applied with a second bias voltage;
   3) a first resistance connected between the first supply terminal and a source of the first PMOS transistor;
   4) a second resistance connected between the second supply terminal and a source of the first NMOS transistor;
   5) a first switch circuit, which selectively connects the first PMOS transistor and the first resistance to the first supply terminal in accordance with the selection signal; and
   6) a second switch circuit, which selectively connects the first NMOS transistor and the second resistance to the second supply terminal in accordance with the selection signal.

5. A dual-amplifier circuit, according to claim 4, wherein the control transistor unit further comprises:
   1) a third NMOS transistor, which is coupled between the first and second supply terminals and has a gate applied with the second bias voltage;
   2) a third resistance connected between the second supply terminal and a source of the third NMOS transistor; and
   3) a third switch circuit, which selectively connects the third NMOS transistor and the third resistance to the second supply terminal in accordance with the selection signal.

6. A dual-amplifier circuit, according to claim 1, wherein the control transistor unit comprises:
   1) a first PMOS transistor, which is coupled between the first and second supply terminals and has a gate applied with a first bias voltage;
   2) a second PMOS transistor, which is connected in series with the first PMOS transistor and has a gate applied with the first bias voltage;
   3) a first NMOS transistor, which is coupled between the first and second supply terminals and has a gate applied with a second bias voltage;
   4) a second NMOS transistor, which is connected in series with the first NMOS transistor and has a gate applied with the second bias voltage;
   5) a first switch circuit, which selectively connects the first PMOS transistor and the second PMOS transistor to the first supply terminal in accordance with the selection signal; and
   6) a second switch circuit, which selectively connects the first NMOS transistor and the second NMOS transistor to the second supply terminal in accordance with the selection signal.

7. A dual-amplifier circuit, according to claim 6, wherein the control transistor unit further comprises:
1) a third NMOS transistor, which is coupled between the first and second supply terminals and has a gate applied with the second bias voltage;
2) a fourth NMOS transistor, which is connected in series with the third NMOS transistor and has a gate applied with the second bias voltage; and
3) a third switch circuit, which selectively connects the third NMOS transistor and the fourth NMOS transistor to the second supply terminal in accordance with the selection signal.

8. A TFT display driving circuit comprising a dual-amplifier circuit according to claim 1, which comprises:
an input terminal to which an input signal is supplied;
an output terminal from which an output signal is supplied;
a first amplifier coupled between the input terminal and the output terminal;
a second amplifier coupled in parallel to the first amplifier between the input terminal and the output terminal;
a selecting circuit which supplies a selection signal to couple one of the first and second amplifiers alternately between the input terminal and the output terminal, wherein
each of the first and second amplifiers comprises:
1) a first supply terminal to which a first level of supply voltage is provided;
2) a second supply terminal to which a second level of supply voltage is provided; and
3) a control transistor unit, which is coupled between the first and second supply terminals and a gate of which is applied with a bias voltage,
wherein a resistance value of the control transistor unit is increased when the corresponding amplifier is not selected for use.

9. A TFT display driving circuit, according to claim 8, wherein the control transistor unit comprises:
1) first and second PMOS transistors, which are coupled in parallel to each other between the first and second supply terminals and each of which has a gate applied with a first bias voltage, the first and second PMOS transistors having different on-resistance values;
2) first and second NMOS transistors, which are coupled in parallel to each other between the first and second supply terminals and each of which has a gate applied with a second bias voltage, the first and second NMOS transistors having different on-resistance values; and
3) a first switch circuit, which selects one of the first and second PMOS transistors for operation in accordance with the selection signal; and
4) a second switch circuit, which selects one of the first and second NMOS transistors for operation in accordance with the selection signal.

10. A TFT display driving circuit, according to claim 9, wherein the control transistor unit further comprises:
1) third and fourth NMOS transistors, which are coupled in parallel to each other between the first and second supply terminals and each of which has a gate applied with the second bias voltage, the second and third NMOS transistors having different on-resistance values; and
2) a third switch circuit, which selects one of the third and fourth NMOS transistors for operation in accordance with the selection signal.

11. A TFT display driving circuit, according to claim 8, wherein the control transistor unit comprises:
1) a first PMOS transistor, which is coupled between the first and second supply terminals and has a gate applied with a first bias voltage;
2) a first NMOS transistor, which is coupled between the first and second supply terminals and has a gate applied with a second bias voltage;
3) a first resistance connected between the first supply terminal and a source of the first PMOS transistor;
4) a second resistance connected between the second supply terminal and a source of the first NMOS transistor;
5) a first switch circuit, which selectively connects the first PMOS transistor and the first resistance to the first supply terminal in accordance with the selection signal; and
6) a second switch circuit, which selectively connects the first NMOS transistor and the second resistance to the second supply terminal in accordance with the selection signal.

12. A TFT display driving circuit, according to claim 11, wherein the control transistor unit further comprises:
1) a third NMOS transistor, which is coupled between the first and second supply terminals and has a gate applied with the second bias voltage;
2) a third resistance connected between the second supply terminal and a source of the third NMOS transistor; and
3) a third switch circuit, which selectively connects the third NMOS transistor and the third resistance to the second supply terminal in accordance with the selection signal.

13. A TFT display driving circuit, according to claim 8, wherein the control transistor unit comprises:
1) a first PMOS transistor, which is coupled between the first and second supply terminals and has a gate applied with a first bias voltage;
2) a second PMOS transistor, which is connected in series with the first PMOS transistor and has a gate applied with the first bias voltage;
3) a first NMOS transistor, which is coupled between the first and second supply terminals and has a gate applied with a second bias voltage;
4) a second NMOS transistor, which is connected in series with the first NMOS transistor and has a gate applied with the second bias voltage;
5) a first switch circuit, which selectively connects the first PMOS transistor and the second PMOS transistor to the first supply terminal in accordance with the selection signal; and
6) a second switch circuit, which selectively connects the first NMOS transistor and the second NMOS transistor to the second supply terminal in accordance with the selection signal.

14. A TFT display driving circuit, according to claim 13, wherein the control transistor unit further comprises:
1) a third NMOS transistor, which is coupled between the first and second supply terminals and has a gate applied with the second bias voltage;
2) a fourth NMOS transistor, which is connected in series with the third NMOS transistor and has a gate applied with the second bias voltage; and
3) a third switch circuit, which selectively connects the third NMOS transistor and the fourth NMOS transistor to the second supply terminal in accordance with the selection signal.

* * * * *